United States Patent
Sung et al.

(10) Patent No.: US 9,374,898 B2
(45) Date of Patent: Jun. 21, 2016

(54) ELECTRICAL AND MECHANICAL INTERCONNECTION FOR ELECTRONIC COMPONENTS

(71) Applicant: Apple Inc., Cupertino, CA (US)

(72) Inventors: Kuo-Hua Sung, Cupertino, CA (US); Silvio Grespan, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 265 days.

(21) Appl. No.: 13/869,881

(22) Filed: Apr. 24, 2013

(65) Prior Publication Data

US 2014/0321075 A1 Oct. 30, 2014

(51) Int. Cl.
| | |
|---|---|
| H01R 4/02 | (2006.01) |
| H01R 9/00 | (2006.01) |
| H05K 1/11 | (2006.01) |
| H01R 12/62 | (2011.01) |
| H01R 43/02 | (2006.01) |
| H05K 3/36 | (2006.01) |

(52) U.S. Cl.
CPC ............... H05K 1/118 (2013.01); H01R 12/62 (2013.01); H01R 43/0249 (2013.01); H05K 1/117 (2013.01); H05K 3/361 (2013.01); H05K 3/363 (2013.01); *H05K 2201/0969* (2013.01); *H05K 2201/0979* (2013.01); *H05K 2201/09481* (2013.01); *H05K 2201/09572* (2013.01); *H05K 2201/09854* (2013.01); *H05K 2203/0126* (2013.01)

(58) Field of Classification Search
CPC .................................. H01R 4/02; H01R 9/097
See application file for complete search history.

(56) References Cited

U.S. PATENT DOCUMENTS

| | | | | |
|---|---|---|---|---|
| 4,740,657 | A | * | 4/1988 | Tsukagoshi et al. ........ 174/88 R |
| 5,428,190 | A | | 6/1995 | Stopperan |
| 5,435,732 | A | * | 7/1995 | Angulas et al. ................. 439/67 |
| 6,064,759 | A | * | 5/2000 | Buckley et al. ............... 382/154 |
| 6,147,870 | A | * | 11/2000 | Pommer ....................... 361/746 |
| 6,294,745 | B1 | | 9/2001 | Gruber |
| 7,103,434 | B2 | * | 9/2006 | Chernyak et al. ............... 700/98 |
| 7,249,955 | B2 | | 7/2007 | Horine et al. |
| 7,448,923 | B2 | * | 11/2008 | Uka .............................. 439/876 |
| 7,625,198 | B2 | * | 12/2009 | Lipson et al. ................. 425/174 |
| 7,785,113 | B2 | * | 8/2010 | Mizoguchi ...................... 439/67 |
| 7,789,285 | B2 | | 9/2010 | Tay et al. |

(Continued)

FOREIGN PATENT DOCUMENTS

EP 0396522 A2 * 11/1990

*Primary Examiner* — Jeremy C Norris
*Assistant Examiner* — Nathan Milakovich
(74) *Attorney, Agent, or Firm* — Downey Brand LLP

(57) ABSTRACT

The described embodiments relate generally to electronic devices and more particularly to methods for forming mechanical and electrical connections between components within an electronic device. In one embodiment, an interconnect component such as a flex cable is attached to a substrate such as a printed circuit board. A plurality of apertures can be created in the interconnect component, passing through bonding pads located on one end of the interconnect component. The interconnect component can then be aligned with bonding pads on the substrate with the bonding pads on the interconnect component facing away from the substrate. A conductive compound can be injected into the apertures through the interconnect component, forming a mechanical and electrical connection between the bonding pads. In some embodiments, an adhesive layer can be used to further strengthen the bond between the interconnect component and the substrate.

18 Claims, 11 Drawing Sheets

A-A

(56) References Cited

U.S. PATENT DOCUMENTS 8,851,356 B1 * 10/2014 Holec et al. .................. 228/103
8,968,006 B1 * 3/2015 Holec et al. .................... 439/65
2008/0057743 A1 * 3/2008 Sogabe ......................... 439/65
2011/0215480 A1 9/2011 Gorezyca et al.
2014/0177180 A1 * 6/2014 Malek et al. ................. 361/749

* cited by examiner

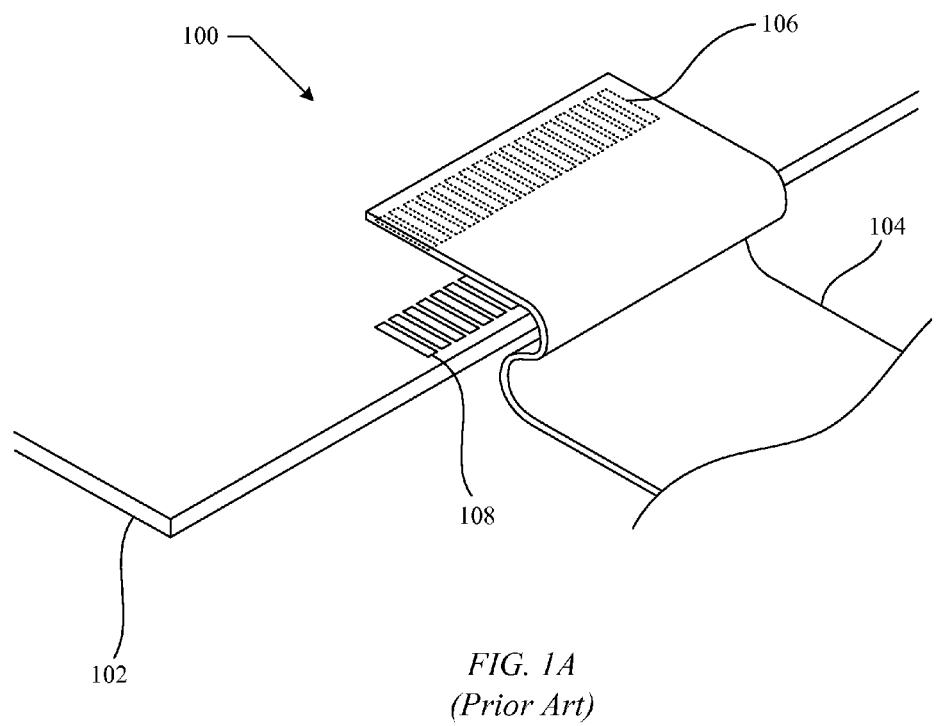
FIG. 1A
(Prior Art)
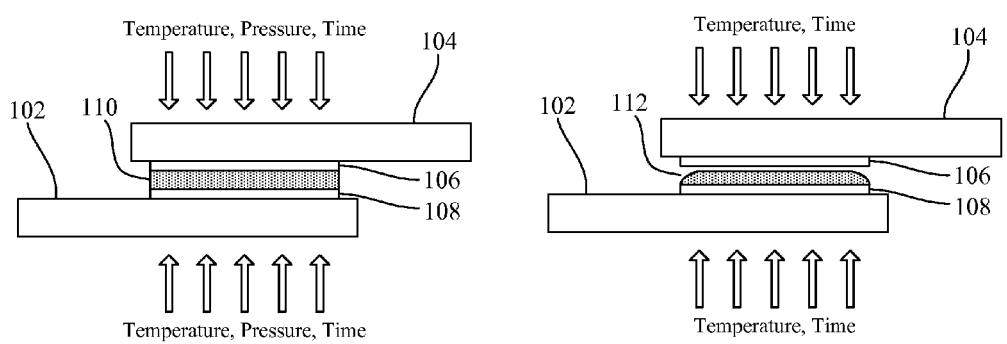
FIG. 1B
(Prior Art)
FIG. 1C
(Prior Art)

A-A

*B-B*

ELECTRICAL AND MECHANICAL INTERCONNECTION FOR ELECTRONIC COMPONENTS

FIELD OF THE DESCRIBED EMBODIMENTS

The described embodiments relate generally to electronic devices and more particularly to methods for forming mechanical and electrical connections between components within an electronic device.

BACKGROUND

Electronic devices can contain a number of electronic components that are electrically and mechanically coupled to one another. For example, many devices employing integrated displays or touch sensitive displays include means for electrically connecting traces on a glass layer to a flex cable that can carry signals from a printed circuit board (PCB). In other designs, a PCB or other component including circuitry can be coupled directly to the glass layer. Due to the shrinking size of many electronic devices, design constraints often drive these connections to be as small as possible. At the same time, many electronic devices are subject to large shock loads and must include connections that are robust enough to allow the device to function reliably over an extended period of time.

One method of forming a connection involves the use of a conductive adhesive layer. Conductive particles can be embedded in a resin or adhesive compound and applied to a base substrate using lamination or printing processes. Anisotropic conductive film (ACF) is commonly used as an adhesive layer. Adhesives such as ACF are capable of achieving a very fine pitch, or distance between adjacent conductors. However, ACF is relatively weak when compared to other bonding methods and can create reliability issues when the connection undergoes stress. Another method involves the use of solder or other conductive pastes such as anisotropic conductive paste (ACP). Conductive pastes can provide a mechanical connection stronger than that of conductive films such as ACF. However, conductive pastes are not capable of achieving the same pitch as adhesives. In some cases, conductive pastes and solder can require a separation between conductors that is 5-10 times greater than that of adhesives.

Therefore, what is desired is a method for mechanically and electrically coupling two electronic components that provides a robust mechanical connection similar to ACP and solder while maintaining a fine pitch similar to ACF.

SUMMARY OF THE DESCRIBED EMBODIMENTS

This paper describes various embodiments that relate to methods for providing an electrical and mechanical connection between a substrate and an interconnect component. In one embodiment, a process for forming a connection is described. The process includes at least the following steps: (1) creating a plurality of apertures in the interconnect component and allowing the apertures to pass at least partially through a plurality of conductive bonding pads located on a first surface of the interconnect component, (2) placing a second surface of the interconnect component opposite the first surface in contact with a surface of the substrate, (3) aligning the interconnect component so that the plurality of conductive bonding pads located on the first surface of the interconnect component are positioned above a plurality of corresponding bonding pads located on the surface of the substrate, and (4) depositing a conductive compound along an outer surface of each of the conductive bonding pads located on the interconnect component. The conductive compound is allowed to fill each of the apertures in the interconnect component, mechanically and electrically coupling the bonding pads located on the interconnect component to the bonding pads located on the substrate.

In another embodiment, an electronic device is described. The electronic device includes a substrate overlaid with circuitry and a series of bonding pads. The electronic device also includes an interconnect component having a first surface and a second surface with a series of bonding pads located on the first surface. The second surface of the interconnect component is positioned adjacent to the surface of the substrate and the bonding pads on the substrate are aligned with the bonding pads on the first surface of the interconnect component. A number of apertures are also included in the interconnect component. The apertures pass at least partially through the conductive bonding pads located on a first surface of the interconnect compound. Finally, a conductive compound is disposed within the apertures. The conductive compound mechanically and electrically couples the interconnect component to the substrate.

In yet another embodiment, a system for mechanically and electrically coupling an interconnect component to a substrate is described. The system includes a lower fixture configured to support the substrate and including one or more positioning features capable of moving the substrate into a pre-defined position. In addition, an upper fixture is included and configured to support the interconnect component. The upper fixture can be rotatably coupled to the lower fixture and can also include one or more positioning features capable of moving the interconnect component into a pre-defined position. The system also includes a nozzle configured to deposit a conductive compound through a plurality of apertures that are included in the interconnect component. Finally, the system includes a controller capable of automatically aligning the interconnect component and the substrate and controlling the position and flow rate of the nozzle. In some embodiments, the upper fixture can rotate relative to the lower fixture after the interconnect component and substrate are aligned, allowing the nozzle access to the apertures on the interconnect component.

In still another embodiment, a non-transient computer readable medium for storing computer code executable by a processor in a computer aided manufacturing system for mechanically and electrically coupling an interconnect component to a substrate is described. The non-transient computer readable medium includes at least the following: (1) computer code for creating a plurality of apertures in the interconnect component and allowing the apertures to pass at least partially through a plurality of conductive bonding pads located on a first surface of the interconnect component, (2) computer code for placing a second surface of the interconnect component opposite the first surface in contact with a surface of the substrate, (3) computer code for aligning the interconnect component so that the plurality of conductive bonding pads located on the first surface of the interconnect component are positioned above a plurality of corresponding bonding pads located on the surface of the substrate, and (4) computer code for depositing a conductive compound along an outer surface of each of the plurality of conductive bonding pads located on the interconnect component. The conductive compound is allowed to fill each of the plurality of apertures in the interconnect component, mechanically and electrically coupling the plurality of bonding pads located on the interconnect component to the plurality of bonding pads located on the substrate.

Other aspects and advantages of the invention will become apparent from the following detailed description taken in conjunction with the accompanying drawings which illustrate, by way of example, the principles of the described embodiments.

BRIEF DESCRIPTION OF THE DRAWINGS

The described embodiments may be better understood by reference to the following description and the accompanying drawings. Additionally, advantages of the described embodiments may be better understood by reference to the following description and accompanying drawings. These drawings do not limit any changes in form and detail that may be made to the described embodiments. Any such changes do not depart from the spirit and scope of the described embodiments.

FIG. 1A shows a prior art connection between a substrate and an interconnect component.

FIG. 1B shows a cross-sectional view of a prior art anisotropic conductive film (ACF) process.

FIG. 1C shows a cross-sectional view of a prior art conductive paste or soldering process.

DETAILED DESCRIPTION OF SELECTED EMBODIMENTS

Figure 2A:
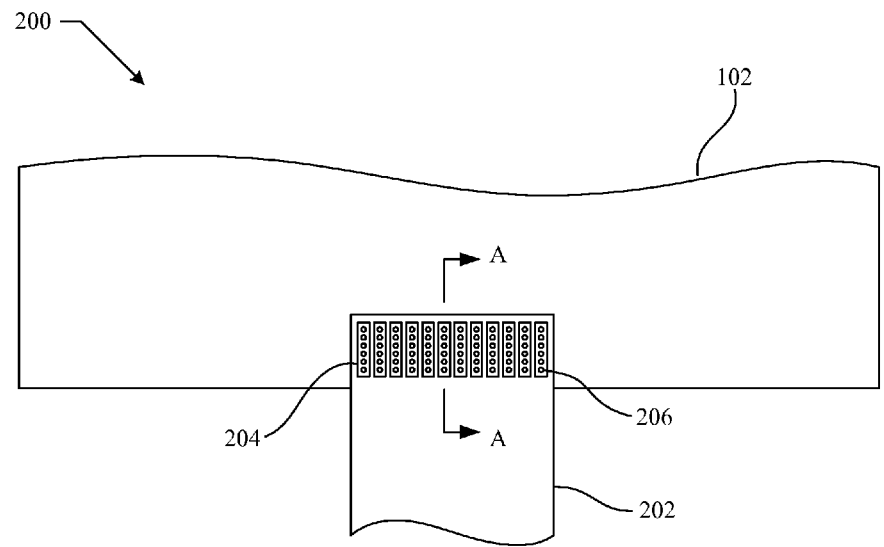
FIG. 2A shows a plan view of an interconnect component coupled to a substrate.

Representative applications of methods and apparatus according to the present application are described in this section. These examples are being provided solely to add context and aid in the understanding of the described embodiments. It will thus be apparent to one skilled in the art that the described embodiments may be practiced without some or all of these specific details. In other instances, well known process steps have not been described in detail in order to avoid unnecessarily obscuring the described embodiments. Other applications are possible, such that the following examples should not be taken as limiting.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments may be used, and changes may be made without departing from the spirit and scope of the described embodiments.

Several methods are described for forming a mechanical and electrical connection between conductive bonding pads on a substrate and an interconnect component. Apertures can be created in the interconnect component that provide an opening through bonding pads on the interconnect component and any structure the bonding pads are attached to. The interconnect component can then be placed over the substrate with the interconnect component bonding pads facing away from the substrate. Once the bonding pads are aligned, a conductive paste or solder can be injected into the apertures, forming a mechanical and electrical connection between the boding pads on the interconnect component and corresponding bonding pads on the substrate. In some embodiments, a non-conductive adhesive can also be used to improve the mechanical connection between the interconnect component and the substrate. In addition, various methods for forming the apertures and injecting conductive materials into the apertures are disclosed.

FIG. 1A shows a prior art assembly demonstrating how an interconnect component such as flex cable 104 can be attached to substrate 102 using conventional methods. Bonding pads 106 can be arranged on a lower surface of flex cable 104, facing substrate 102. Similarly, bonding pads 108 can be arranged on an upper surface of substrate 102 and aligned with bonding pads 106. Substrate 102 can represent a printed circuit board, glass substrate, flexible substrate, or any other surface on which circuitry can be overlaid in an electronic device. In addition, flex cable 104 can be replaced by several other components, including another rigid substrate, rigid flex, or any other interconnect component including bonding pads.

FIG. 1B shows a cross-sectional view of assembly 100 demonstrating a prior art method for mechanically and electrically coupling substrate 102 and flex cable 104 using anisotropic conductive film (ACF) or any similar conductive adhesive. Bonding pads 106 on flex cable 104 can be aligned downwards to face bonding pads 108. Then, conductive film 110 can be deposited on either bonding pads 106 or bonding pads 108. Once conductive film 110 is in place, bonding pads 106 on flex cable 104 can be adhered to bonding pads 108 on substrate 102 by aligning the bonding pads and applying pressure. In some cases, heat can also be applied to properly cure conductive film 110. The resulting bond can achieve a high density pitch (spacing between adjacent conductive pads) but can produce a relatively weak bond that can compromise the reliability of the connection.

FIG. 1C shows a cross-sectional view of an alternative assembly 100 demonstrating another prior art method for coupling substrate 102 and flex cable 104 using conductive paste or solder. Conductive paste 112 can be applied to either bonding pads 106 on flex cable 104 or bonding pads 108 on substrate 102. Then, corresponding bonding pads on substrate 102 and flex cable 104 an be place in contact with one another and heat can be applied, causing conductive paste 112 to melt and reform, creating an electrical and mechanical bond between bonding pads 106 and 108. The resulting mechanical bond can be relatively strong. However, the use of conductive paste or solder cannot achieve the fine pitch that is available with conductive film. As a result, the bonding area must take up greater room on substrate 102.

FIG. 2A shows assembly 200, demonstrating a method for creating a connection that can provide a strong mechanical connection similar to that available using conductive paste and solder while maintaining a fine pitch that is commonly available only when using conductive films such as ACF. Substrate 102 can represent any component within an electrical device that is overlaid with circuitry and includes bonding pads for electrically and mechanically connecting to an interconnect component or other electronic component. In some embodiments, substrate 102 can represent a printed circuit board (PCB). In other embodiments, substrate 102 can represent a glass substrate overlaid with circuitry such as a thin film transistor glass layer in an LCD display or a capacitive glass layer in a touch screen assembly. In other embodiments, substrate 102 can represent a flexible structure such as rigid flex or any other technically feasible surface on which circuitry can be overlaid in an electronic device. A number of bonding pads 108 can be provided on a surface of substrate 102 and electrically coupled to circuitry overlaid on substrate 102.

Interconnect component 202 can be positioned adjacent to substrate 102 and can be electrically and mechanically coupled to substrate 102 and bonding pads 108. As pictured, interconnect component 202 represents a flex cable. However, the disclosed method can be used with a variety of interconnect components. In other embodiments, interconnect component 202 can represent a PCB, glass layer, rigid flex assembly, or any other technically feasible component including circuitry and bonding pads. Interconnect component 202 can include a number of bonding pads 204 oriented away from substrate 102. Bonding pads 204 can be electrically coupled to traces within interconnect component 202 that carry electrical signals between substrate 102 and another electronic component. Furthermore, bonding pads 204 can be formed from a metallic conductor such as copper or any other suitably rigid conductive material. A number of apertures 206 can be provided in each of bonding pads 204. Apertures 206 can represent an opening that passes through bonding pad 204 and interconnect component 202, provide access to bonding pads 108 on substrate 102. Various shapes and configurations of apertures 206 are discussed below in FIGS. 3A-3F.

Figure 2B:
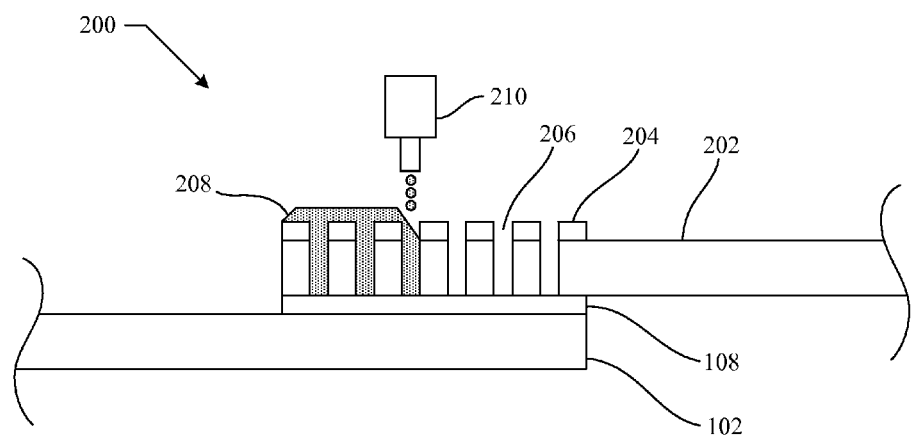
FIG. 2B shows a cross-sectional view of an interconnect component coupled to a substrate.

FIG. 2B shows cross-sectional view A-A taken from FIG. 2A and demonstrates the process by which interconnect component 202 can be electrically and mechanically bonded to substrate 102 using apertures 206. Substrate 102 is positioned with bonding pads 108 facing upwards and interconnect component 202 is placed in contact with bonding pads 108 with bonding pads 204 also facing upwards. Then, nozzle 210 can deposit conductive compound 208 along an upper surface of bonding pad 204 and into apertures 206. Once conductive compound 208 is deposited, a robust mechanical and electrical connection is formed between bonding pads 108 and bonding pads 204. Conductive compound 208 can represent a variety of different compounds, including anisotropic conductive paste (ACP), solder, silver ink, Ag materials, or any other technically feasible compound capable of forming an electrical connection between bonding pads 108 and 204. In addition, conductive compound 208 can be applied using a variety of methods including printing processes, jetting processes, thermal sintering processes, and any other technically feasible means of precisely applying conductive compound 208 to assembly 200.

Figures 3A, 3B:
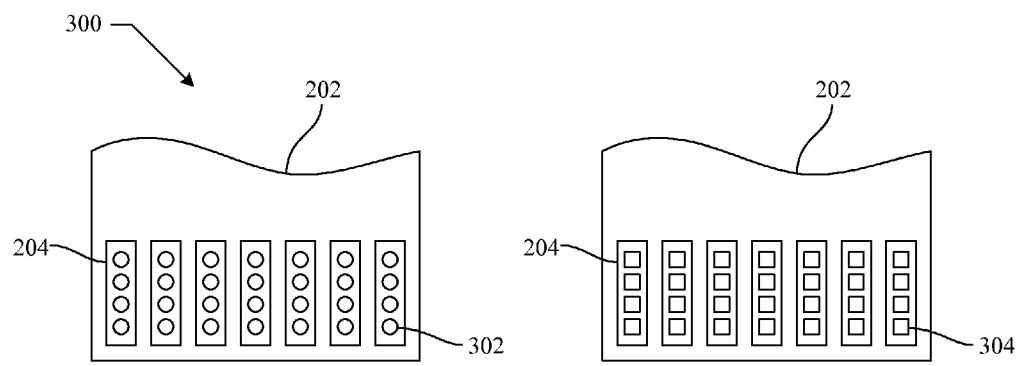
FIG. 3A shows an interconnect component with circular apertures.
FIG. 3B shows an interconnect component with square apertures.
Figures 3C, 3D:
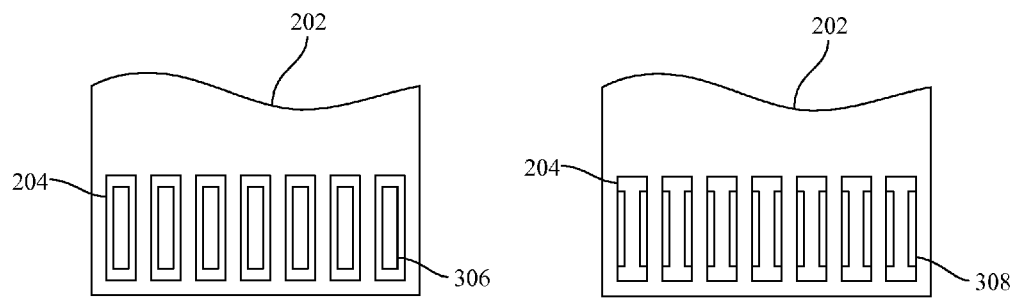
FIG. 3C shows an interconnect component with a single aperture.
FIG. 3D shows an interconnect component with rectangular notches disposed along the sides of the conductive pads.

FIGS. 3A-3F show various embodiments of interconnect component 300 utilizing different types of apertures. As is described below, the type of aperture chosen can depend on the design requirements and limitations of a particular application. In FIG. 3A, a number of circular apertures 302 are provided. Circular apertures 302 can be preferable when a process such as drilling is used to create the apertures. However, a variety of different shaped apertures can be used. For example, FIG. 3B shows a series of square apertures 304. In addition to squares, any other suitable shape can be used to create apertures 304. Furthermore, the size of apertures 304 can vary. In applications involving devices that are subject to significant shock loads, apertures with additional area can be helpful in providing additional bonding area for conductive compound 208. In some embodiments, it can be preferable to include apertures 304 that cover approximately 25%-50% of bonding pads 204. However, aperture areas outside of this range can be used as well. FIG. 3C shows an embodiment in which a single aperture 306 is positioned in each of bonding pads 204. As shown, apertures 306 have a rectangular shape. However, any other suitable shape can be used. A single aperture, such as aperture 306, can be advantageous when a large bonding surface is desired between conductive compound 208 and bonding pad 108. However, multiple apertures, such as those depicted in FIGS. 3A and 3B can provide additional redundancy to the connection. For example, if an electrical connection through one of apertures 302 fails, a signal can still be passed through other apertures 302 located on the same bonding pad 204.

Figures 3E, 3F:
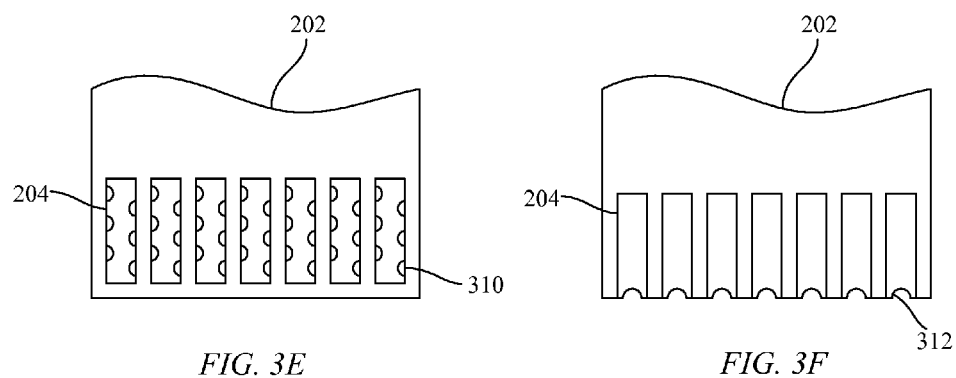
FIG. 3E shows an interconnect component with notches disposed along the sides of the conductive pads.
FIG. 3F shows an interconnect component with notches disposed at the ends of the conductive pads.

In some embodiments, notches can be provided along a periphery of each of bonding pads 204. FIGS. 3D-3F show various embodiments employing such notches. In FIG. 3D, rectangular notches are provided alongside sections of bonding pads 204 and in FIG. 3E semicircular notches are provided along a periphery of bonding pads 204. While rectangular and semi-circular apertures are shown, any shape of notch suitable for allowing a conductive compound to pass through can be used. FIG. 3F shows another embodiment, in which bonding pads 204 are allowed to extend to an edge of interconnect component 202 and notches are placed along the edge. This embodiment can be useful when additional adhesives are used to bond interconnect component 202 to substrate 102 such as is described below in FIG. 7. Apertures 302, 304, 306, 308, 310, and 312 can be created using various processes including drilling, laser cutting, etching, or any other technically feasible process for creating apertures.

Figure 4A:
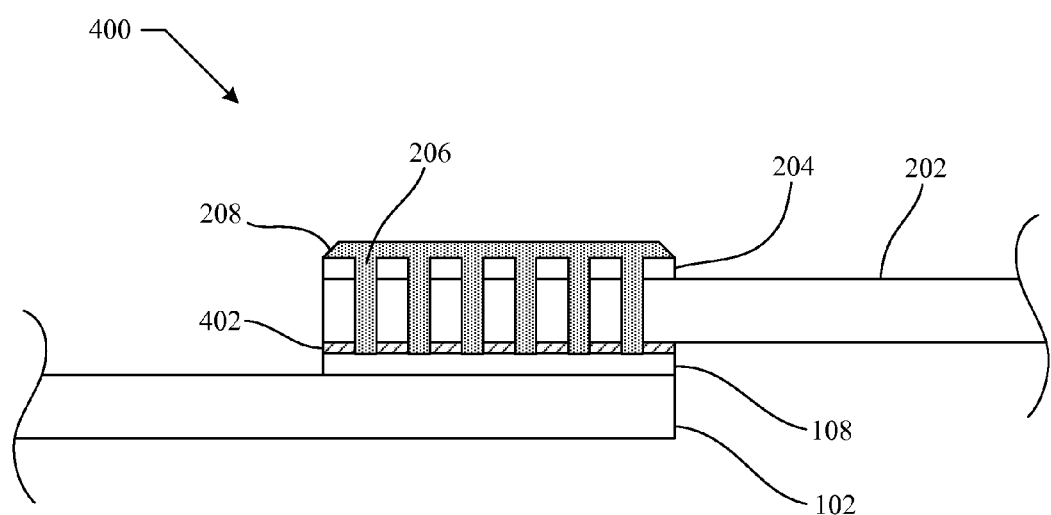
FIG. 4A shows a cross-sectional view of an interconnect component coupled to a substrate using an adhesive layer.

FIG. 4a shows a cross-sectional view of assembly 400, demonstrating how an additional adhesive layer 402 can increase the mechanical connection between substrate 102 and interconnect component 202. Interconnect component 202 can be aligned and placed in contact with substrate 102 and conductive compound 208 can be deposited through apertures 206 and along an upper surface of bonding pad 204, forming an electrical and mechanical connection between bonding pads 108 and 204. In situations where additional mechanical adhesion is needed, adhesive layer 402 can be positioned between interconnect component 202 and substrate 102. Adhesive layer 402 can represent an adhesive film, adhesive tape, epoxy resin, or any other suitable adhesive. In some embodiments, adhesive layer 402 can be applied to either interconnect component 202 or substrate 102 prior to bringing the two components in contact with one another. Adhesive layer 402 can be applied using a laminating process, printing process, manual application, or any other technically feasible means of depositing an adhesive layer.

In some embodiments, adhesive layer 402 can include openings configured to align with apertures 206 in interconnect component 202 so that conductive compound 208 can flow through adhesive layer 402 and reach bonding pads 108. In other embodiments, adhesive layer 402 can be applied prior to creating apertures 206, and openings in adhesive layer 402 can be created using the same process that creates apertures 206. Adhesive layer 402 can also be applied between individual bonding pads 108 and 204 and directly onto interconnect component 202 and substrate 102. This can provide additional adhesion between the two components. To prevent signals from cross from one bonding pad to another, adhesive layer 402 can be formed from a non-conductive material. However, in other embodiments, adhesive layer 402 can be limited to bonding pads 108 and can be formed from a conductive material such as ACF. This can provide additional paths for signals to transfer from conductive compound 208 to bonding pads 108.

Figure 4B:
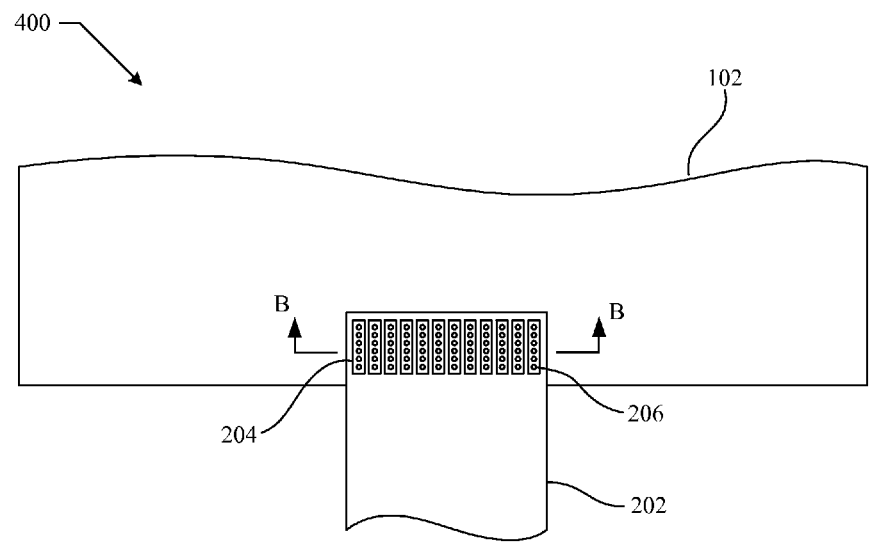
FIG. 4B shows a plan view of an interconnect component coupled to a substrate using an adhesive layer.
Figure 4C:
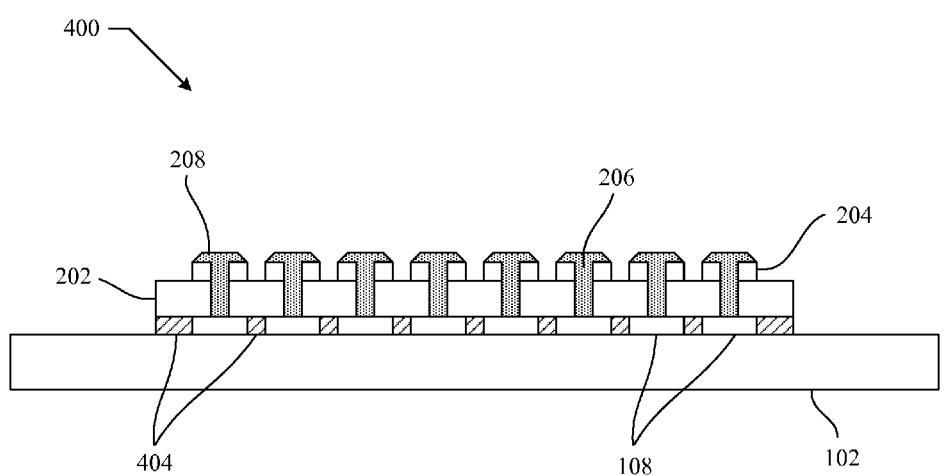
FIG. 4C shows a cross-sectional view of an interconnect component coupled to a substrate using an adhesive layer.

FIGS. 4B and 4C show another embodiment in which adhesives are restricted to non-conductive areas of substrate 102 and interconnect component 202. FIG. 4B shows a plan view of assembly 400, including view B-B taken across interconnect component 202. FIG. 4C shows cross-sectional view B-B, demonstrating how adhesive layer 404 is selectively applied to substrate 102. Adhesive layer 404 can be limited to areas around and between bonding pads 108 only. By limiting adhesive layer 404 to non-conductive regions, the risk that adhesive layer 404 will interfere with the mechanical and electrical connection between conductive compound 208 and bonding pads 108 can be reduced. In some embodiments, the thickness of bonding pads 108 and adhesive layer 404 can be approximately equal to provide a flat surface for interconnect component 202 to interface with. Similar to adhesive layer 402 in FIG. 4A, adhesive layer 404 can be formed from non-conductive materials including adhesive film, adhesive tape, epoxy resin, or any other suitable adhesive. Furthermore, adhesive layer 404 can be applied to either substrate 102 or interconnect component 202 prior to assembly.

Figure 5A:
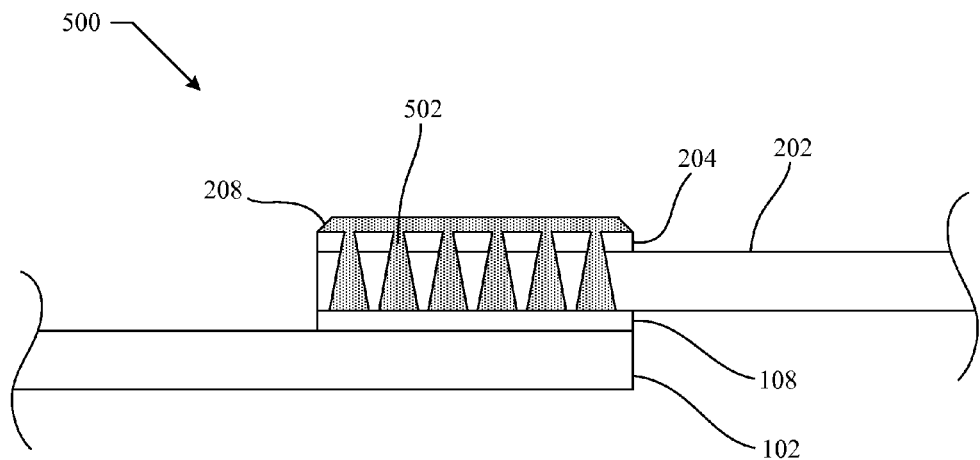
FIG. 5A shows a cross-sectional view of an interconnect component containing apertures with varying shape.
Figure 5B:
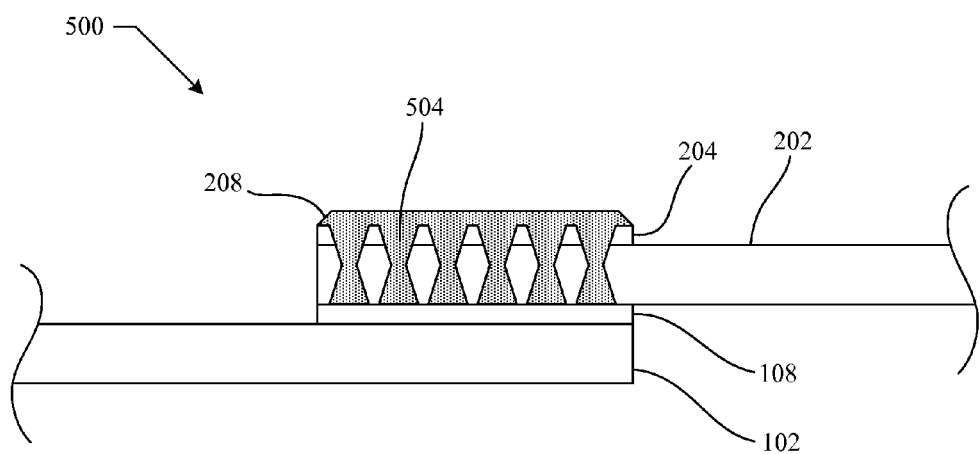
FIG. 5B shows a cross-sectional view of an interconnect component containing apertures with varying shape.

FIGS. 5A and 5B show cross-sectional views of assembly 500, demonstrating how apertures 502 and 504 can vary as a function of depth. In some designs, additional surface area in regions where conductive compound 208 contacts bonding pads 108 can be advantageous for providing stronger mechanical and electrical bonds. For example, additional mechanical adhesion can be helpful in meeting design requirements when adhesives such as those described in FIG. 4 are not used. When this is the case, the geometry of apertures 502 and 504 can vary as a function of depth to provide a larger contact area along a bottom surface of interconnect component 202 without removing an excessive amount of material from bonding pads 204 and interconnect component 202. In FIG. 5A, apertures 502 are formed in a truncated cone shape, providing a large surface area for bonding conductive compound 208 to bonding pads 108. Alternatively, in FIG. 5B, aperture 504 is shaped to have increased area at both upper and lower surfaces. This shape can be advantageous when additional area is needed along an upper surface of bonding pads 204 for directing conductive compound 208 into apertures 504 during the manufacturing process. In addition to the aperture shapes shown in FIGS. 5A and 5B, any other suitable shape can be used according to specific design criteria.

Figure 6:
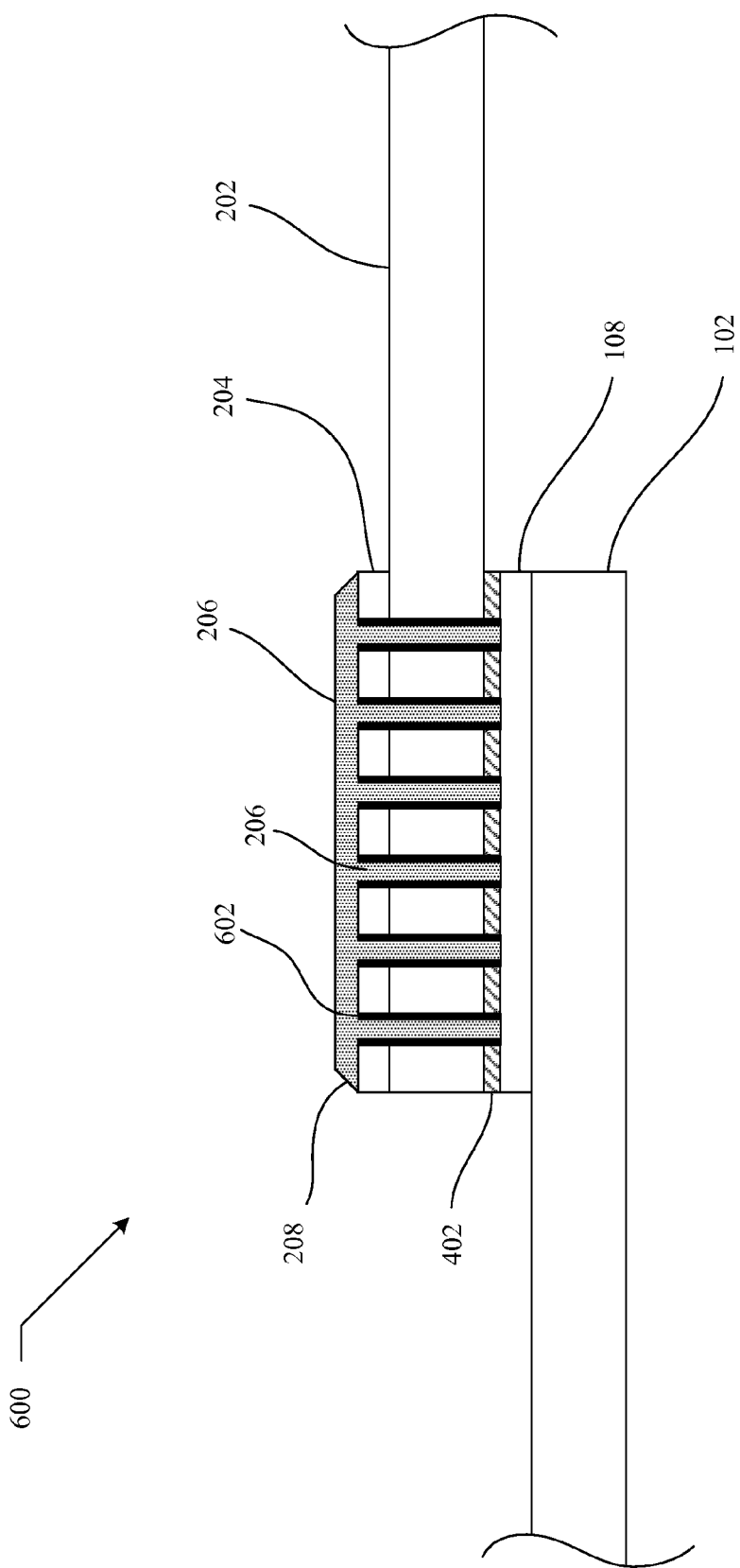
FIG. 6 shows a cross sectional view of an interconnect component with plated apertures.

FIG. 6 shows a cross-sectional view of assembly 600, demonstrating how apertures 206 can be plated to increase conductivity between bonding pads 204 and bonding pads 108. In some cases, a risk exists that a void or air bubble can form within openings 206, preventing conductive compound 208 from forming an electrical connection between bonding pad 204 and bonding pad 108. To alleviate this risk, side walls of apertures 206 can be plated with conductive material 602. Conductive material 602 can be applied using conventional via plating techniques using any suitable conductive material such as copper. Assembly 600 is shown with adhesive layer 402 providing additional adhesion between interconnect component 202 and substrate 102. However, plating techniques can be used when adhesive layer 402 is absent as well.

Figure 7:
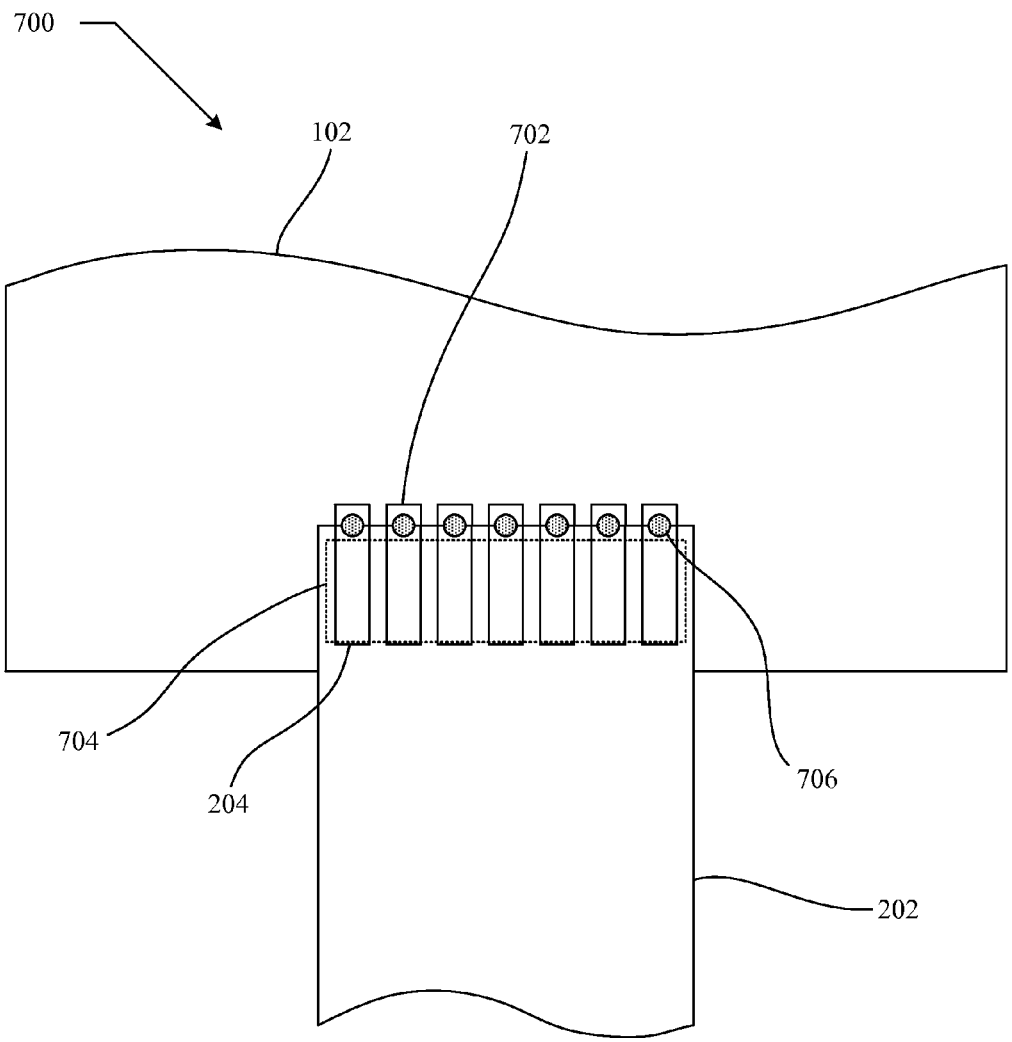
FIG. 7 shows a plan view of an interconnect component coupled to a substrate using an adhesive layer and a notch.

FIG. 7 shows a plan view of assembly 700, demonstrating an alternative method for electrically and mechanically coupling substrate 102 to interconnect component 202. Bonding pads 204 on interconnect component 202 can be posited along an edge of interconnect component 202 and notches 312 can be provided in bonding pads 204 along the edge. Additional detail of this configuration are shown above in FIG. 3F. Bonding pads 702 can be coupled to substrate 102 and positioned so that a portion of bonding pads 702 are not covered by interconnect component 202. Conductive compound 706 can then be applied within each of notches 312, electrically coupling bonding pads 204 to bonding pads 702. Conductive compound 706 can represent solder, silver ink, Ag materials, or any other technically feasible compound capable of forming an electrical connection between bonding pads 702 and 204. Furthermore, conductive compound 706 can be applied using any of the above mentioned techniques, including printing, jetting, and manual application. To provide mechanical adhesion, adhesive layer 704 can be placed between interconnect component 202 and substrate 102 in a region outside of conductive compound 706. Adhesive layer 704 can have properties similar to adhesive layer 402 described in FIG. 4. The combination of conductive compound 706 and adhesive layer 704 can provide a robust mechanical and electrical connection between substrate 102 and interconnect component 202.

Figure 8A:
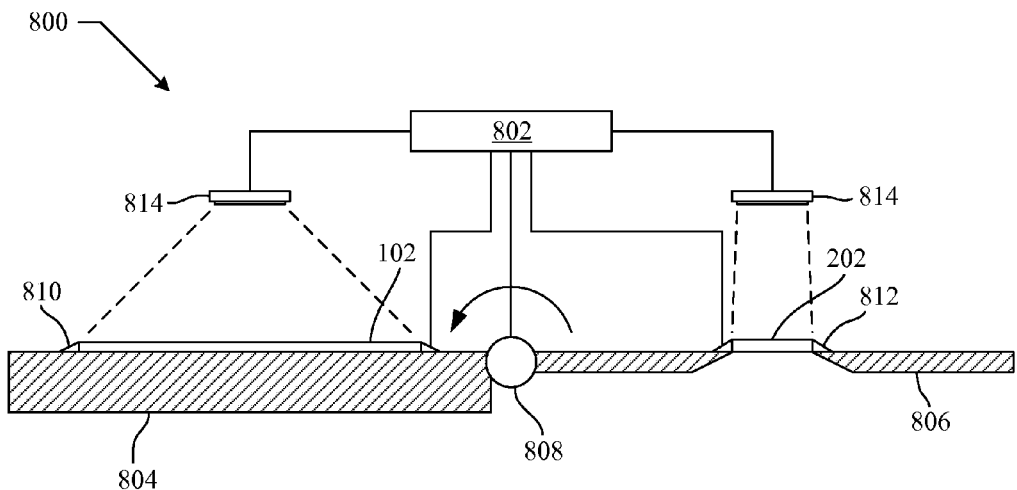
FIG. 8A shows a system for aligning and coupling an interconnect component to a substrate.
Figure 8B:
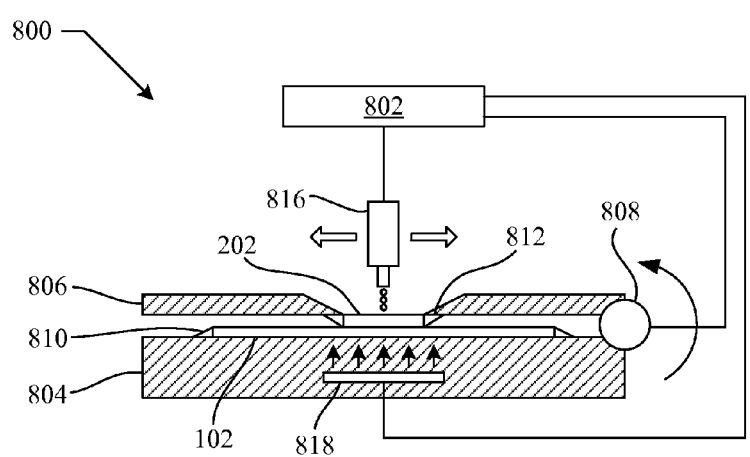
FIG. 8B shows a system for aligning and coupling an interconnect component to a substrate in a closed position.

FIGS. 8A and 8B show system 800 capable of performing the manufacturing operations described in the present disclosure. FIG. 8A shows system 800 in an open configuration. Fixtures 804 and 806 can position substrate 102 and interconnect component 202 respectively. In addition, fixtures 804 and 806 can be hingedly coupled by rotation servo 808, allowing fixture 804 and fixture 806 to rotate relative to one another. Positioning features 810 and 812 can move substrate 102 and interconnect component 202 respectively to align the components properly within fixtures 804 and 806. In some embodiments, sensors 814 can be provided to sense the positions of substrate 102 and interconnect component 202 to aid in the alignment process. Sensors 814 can include mechanical sensors, optical sensors, or any other sensor capable of detecting the position of substrate 102 and interconnect component 202. In some embodiments, the position of substrate 102 and interconnect component 202 can be adjusted manually in response to inputs from sensors 814. In other embodiments, controller 802 can automate the process by automatically directing positioning features 810 and 812 to position substrate 102 and interconnect component 202 in response to input signals from sensors 814. Controller 802 can also direct rotation servo 808 to rotate fixture 806 into a closed position once the alignment process is complete.

FIG. 8B shows system 800 in a closed position. Once fixture 806 is rotated relative to fixture 804, interconnect component 202 is positioned above substrate 102 with the bonding pads on each component aligned with one another. An opening can be provided in fixture 806 to provide access to nozzle 816. Nozzle 816 can dispense conductive compound 208 through apertures provided in interconnect component 202 using a variety of methods including printing processes, jetting processes, thermal sintering processes, and any other technically feasible means of precisely applying conductive compound 208 to the assembly. In some embodiments, heating element 818 can be embedded in fixture 804 or fixture 806 to aid in curing conductive compound 208. If an adhesive layer is included in the assembly, heating element 818 can cure the adhesive layer as well. In other embodiments, the adhesive layer can be cured using other means such as ultraviolet light, time, pressure, or any combination of suitable curing techniques.

In some embodiments, controller 802 can automatically control the position of nozzle 816 and amount of conductive compound 208 dispensed by nozzle 816. In addition, controller 802 can control the temperature of heating element 818. User inputs can provide operating parameters to controller 802 that can be used to instruct computer code stored within controller 802 on means of implementing the methods described in the present disclosure. In some embodiments, fixtures 804 and 806 can be positioned relative to one another using mechanical arms, a hydraulic press, or any other feasible means of moving one fixture relative to another.

Figure 9:
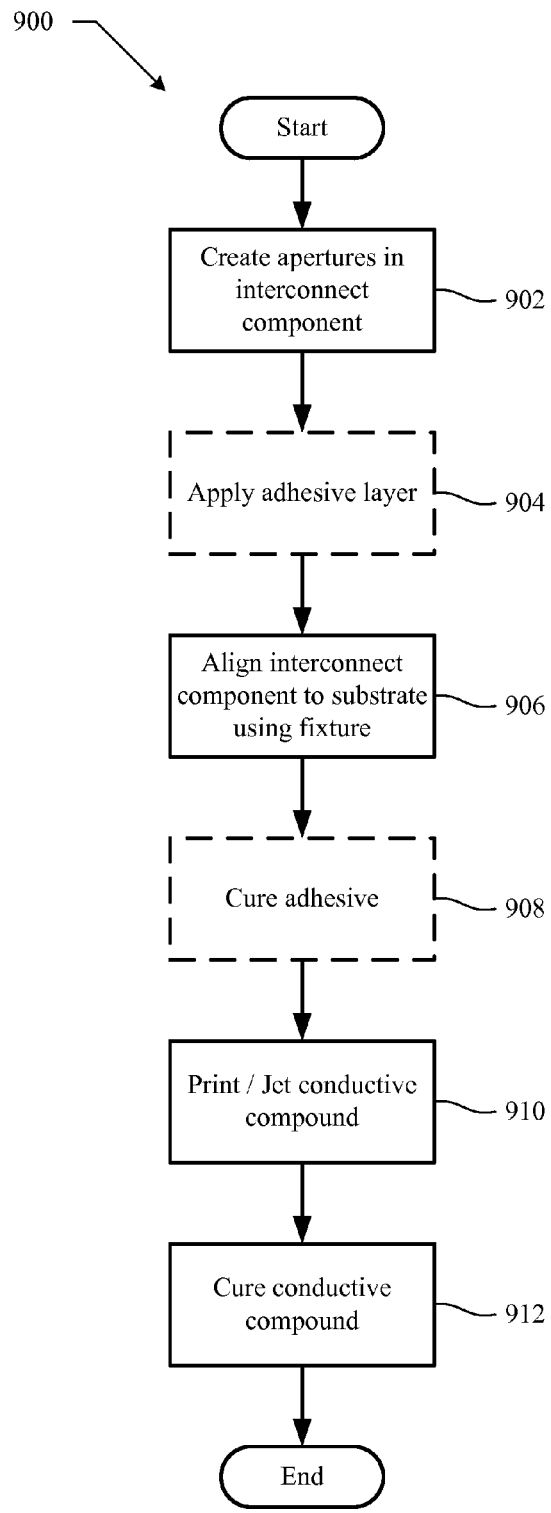
FIG. 9 shows a flow chart describing a process for coupling an interconnect component and a substrate.

FIG. 9 shows a flowchart depicting process 900, demonstrating a manufacturing process for implementing the various embodiments described in the present disclosure. In step 902, apertures can be created in an interconnect component. The apertures can extend through both structural elements of the interconnect component and bonding pads intended to interface with a corresponding substrate. The apertures can be formed in a variety of shapes including circles, squares, notches, and any other suitable shape. In some embodiments, the shape of the apertures can vary as a function of depth as well. The apertures can be created using a variety of processes including drilling, laser cutting, etching, or any other technically feasible process for creating apertures. Next, in optional step 904, an adhesive layer can be applied to either the interconnect component or the substrate. The adhesive layer can provide an additional mechanical connection between the interconnect component and the substrate. The adhesive layer can include an adhesive film, adhesive tape, epoxy resin, or any other suitable adhesive. Furthermore, the adhesive layer can be applied using a laminating process, printing process, manual application, or any other technically feasible means of depositing an adhesive layer.

In step 906, the interconnect component can be aligned to the substrate using a fixture. In one embodiment, a rotating fixture with automatic sensors and alignment features such as system 800 described in FIG. 8 can be used. In other embodiments, non-rotating fixtures can be used as well. The fixture can align the substrate and interconnect component so that corresponding bonding pads come into contact with one another. Next, in optional step 908, an adhesive that may have been added in step 904 can be cured. If the adhesive is pressure sensitive, then the fixture can apply the appropriate pressure to form a bond between the substrate and the interconnect component. If the adhesive is heat activated, then the fixture can include a heating feature for curing the adhesives. In other embodiments, the adhesive layer be cured using UV light or a combination of heat and UV light. In some embodiments, the adhesive can be cured at the same time as the conductive compound in step 912.

In step 910, the conductive compound is deposited along an upper surface of bonding pads included in the interconnect component and injected into the apertures created in step 902. A variety of different conductive compounds can be used including anisotropic conductive paste (ACP), solder, silver ink, Ag materials, or any other technically feasible compound capable of forming an electrical connection between the bonding pads. In addition, the conductive compound can be applied using a variety of methods including printing processes, jetting processes, thermal sintering processes, and any other technically feasible means of precisely applying the conductive compound. Finally, in step 912, the conductive compound can be cured. Depending on the compound used, this can involve the application of heat, pressure, time, UV light or any other technically feasible means of curing. In some embodiments, the optional adhesive layer applied in step 904 can be cured at the same time as the conductive compound.

Figure 10:
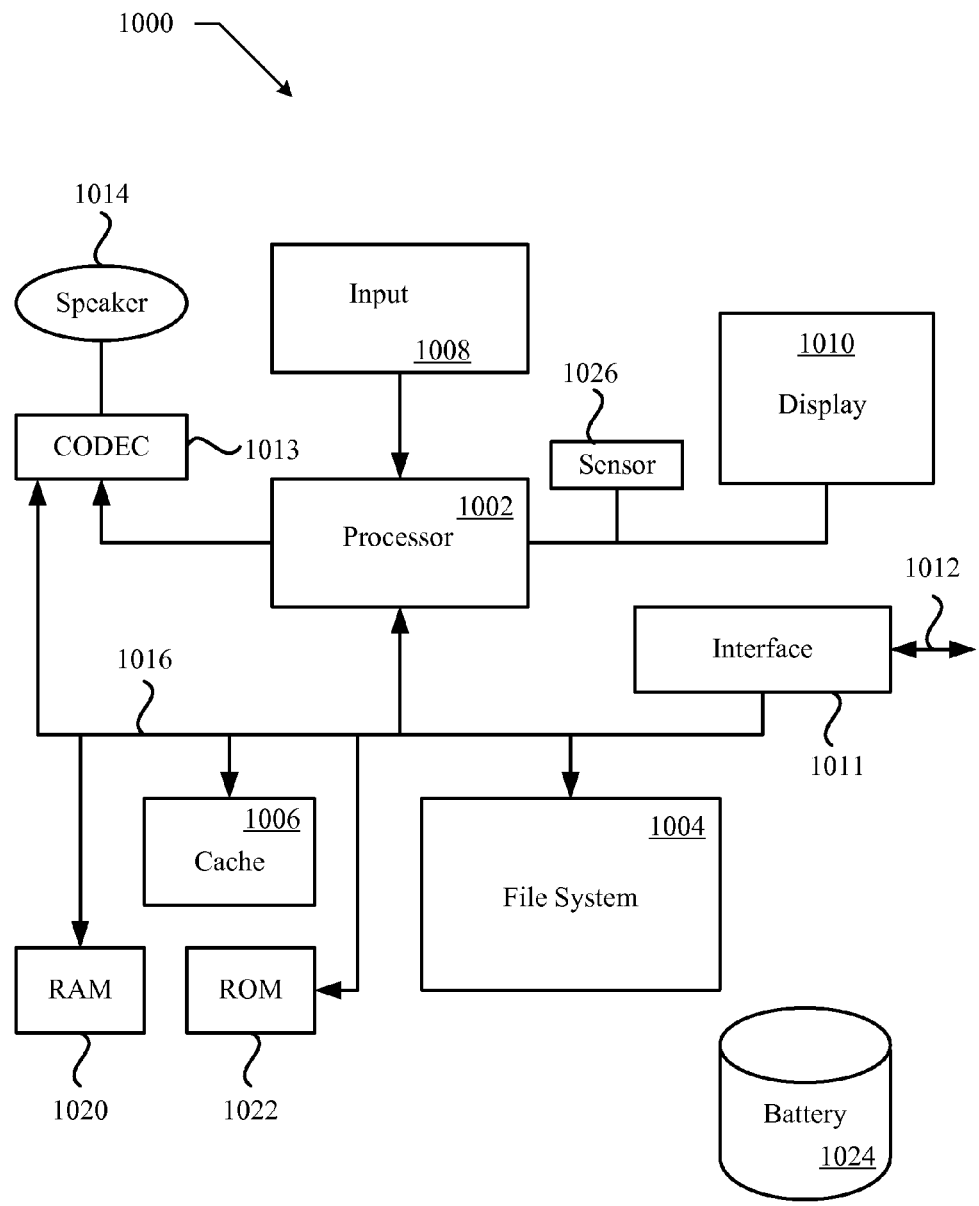
FIG. 10 shows a block diagram of an electronic controller capable of controlling the manufacturing process.

FIG. 10 is a block diagram of electronic controller 1000 suitable for controlling some of the processes in the described embodiment. For example, controller 1000 can represent controller 802 in system 800 shown in FIG. 8. Controller 1000 illustrates circuitry of a representative computing device. Controller 1000 includes a processor 1002 that pertains to a microprocessor or controller for controlling the overall operation of controller 1000. Controller 1000 contains instruction data pertaining to manufacturing instructions in a file system 1004 and a cache 1006. The file system 1004 is, typically, a storage disk or a plurality of disks. The file system 1004 typically provides high capacity storage capability for the controller 1000. However, since the access time to the file system 1004 is relatively slow, the controller 1000 can also include a cache 1006. The cache 1006 is, for example, Random-Access Memory (RAM) provided by semiconductor memory. The relative access time to the cache 1006 is substantially shorter than for the file system 1004. However, the cache 1006 does not have the large storage capacity of the file system 1004. Further, the file system 1004, when active, consumes more power than does the cache 1006. The power consumption is often a concern when the controller 1000 is a portable device that is powered by a battery 1024. The controller 1000 can also include a RAM 1020 and a Read-Only Memory (ROM) 1022. The ROM 1022 can store programs, utilities or processes to be executed in a non-volatile manner. The RAM 1020 provides volatile data storage, such as for cache 1006.

The controller 1000 also includes a user input device 1008 that allows a user of the controller 1000 to interact with the controller 1000. For example, the user input device 1008 can take a variety of forms, such as a button, keypad, dial, touch screen, audio input interface, visual/image capture input interface, input in the form of sensor data, etc. Still further, the controller 1000 includes a display 1010 (screen display) that can be controlled by the processor 1002 to display information to the user. A data bus 1016 can facilitate data transfer between at least the file system 1004, the cache 1006, the processor 1002, and a CODEC 1013. The CODEC 1013 can be used to decode and play a plurality of media items from file system 1004 that can correspond to certain activities taking place during a particular manufacturing process. The processor 1002, upon a certain manufacturing event occurring, supplies the media data (e.g., audio file) for the particular media item to a coder/decoder (CODEC) 1013. The CODEC 1013 then produces analog output signals for a speaker 1014. The speaker 1014 can be a speaker internal or external to the controller 1000. For example, headphones or earphones that connect to the controller 1000 would be considered an external speaker.

The controller 1000 also includes a network/bus interface 1011 that couples to a data link 1012. The data link 1012 allows the controller 1000 to couple to a host computer or to accessory devices. The data link 1012 can be provided over a wired connection or a wireless connection. In the case of a wireless connection, the network/bus interface 1011 can include a wireless transceiver. The media items can be any combination of audio, graphical or visual content. Sensor 1026 can take the form of circuitry for detecting any number of stimuli. For example, sensor 1026 can include any number of sensors for monitoring a manufacturing operation such as for example, a mechanical positioning sensor, an optical or laser sensor, a Hall Effect sensor responsive to external magnetic field, an audio sensor, a light sensor such as a photometer, and so on.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data which can thereafter be read by a computer system. Examples of the computer readable medium include read-only memory, random-access memory, CD-ROMs, HDDs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. A method for providing an electrical and mechanical connection between a substrate and an interconnect component, the method comprising:
    disposing a first conductive bonding pad over a first surface of the interconnect component;
    forming a first aperture that extends through the first conductive bonding pad;
    forming a second aperture through the interconnect component, the second aperture aligned with the first aperture and extending from the first surface to a second surface of the interconnect component opposite the first surface, wherein the second surface comprises a planar surface;
    engaging the second surface with a second conductive bonding pad disposed on the substrate; and
    depositing a conductive compound into the first aperture and the second aperture, wherein depositing the conductive compound mechanically and electrically couples the first conductive bonding pad to the second conductive bonding pad, and wherein the electrical and mechanical connection between the substrate and the interconnect component is defined by a combined thickness of the interconnect component, the conductive compound, the substrate, the first conductive bonding pad, and the second conductive bonding pad.

2. The method as recited in claim 1, further comprising:
    prior to placing the second surface of the interconnect component in contact with the surface of the substrate, applying an adhesive layer between the interconnect component and the substrate, the adhesive layer having an opening aligned with the second aperture, wherein the combined thickness of the interconnect component, the conductive compound, the substrate, the first conductive bonding pad, and the second conductive bonding pad, and the adhesive layer.

3. The method as recited in claim 2, wherein the adhesive layer comprises an anisotropic conductive film.

4. The method as recited in claim 1, further comprising plating an interior surface of the first aperture an and interior surface of the second aperture prior to depositing the conductive compound.

5. A non-transient computer readable medium for storing computer code executable by a processor in a computer aided manufacturing system for mechanically and electrically coupling an interconnect component to a substrate, the non-transient computer readable medium comprising:
    computer code for creating a plurality of apertures in the interconnect component, wherein the plurality of apertures pass at least partially through a plurality of conductive bonding pads located on a first surface of the interconnect component;
    computer code for adhesively securing a second surface of the interconnect component opposite the first surface with a surface of the substrate, by an adhesive layer that engages the second surface and the surface of the substrate;
    computer code for aligning the interconnect component so that the plurality of conductive bonding pads located in the first surface of the interconnect component are positioned above a plurality of corresponding bonding pads located on the surface of the substrate; and
    computer code for depositing a conductive compound along an outer surface of each of the plurality of conductive bonding pads located on the interconnect component, wherein the conductive compound is allowed to fill each of the plurality of apertures in the interconnect component, mechanically and electrically coupling the plurality of bonding pads located on the interconnect component to the plurality of corresponding bonding pads located on the substrate, and wherein the interconnect component maintains a uniform thickness from the first surface to the second surface.

6. The non-transient computer readable medium as recited in claim 5, further comprising:
    computer code for receiving data from one or more sensors capable of sensing a position of the substrate and the interconnect component; and
    computer code for using the position of the substrate and the interconnect component to control positioning features configured to align the substrate with the interconnect component.

7. The non-transient computer readable medium as recited in claim 6, further comprising computer code for controlling a heating element embedded in a fixture holding the substrate, wherein the heating element provides heat necessary to cure the conductive compound.

8. The non-transient computer readable medium as recited in claim 7, further comprising computer code for rotating an upper fixture holding the interconnect component into a lower fixture holding the substrate after the interconnect component and the substrate are aligned.

9. The method as recited in claim 1, wherein the substrate is a printed circuit board.

10. The method as recited claim 1, wherein the substrate is a glass layer functioning as a display for an electronic device.

11. The method as recited in claim 1, wherein creating the second aperture comprises creating the second aperture in a flex cable.

12. The method as recited in claim 1, further comprising depositing the conductive compound along an outer surface of the first conductive bonding pad.

13. The method as recited in claim 12, wherein depositing the conductive compound along the outer surface of the first conductive bonding pad comprises depositing solder.

14. The method as recited in claim 1, wherein creating the second aperture comprises creating a notch disposed along a periphery of the first conductive bonding pad.

15. The method as recited in claim 1, wherein the first aperture is formed along an edge of the first conductive bond pad to define a notch.

16. The method as recited in claim 1, wherein a diameter second aperture varies from the first surface of the interconnect component to the second surface of the interconnect component.

17. The method as recited in claim 16, wherein the diameter gradually increases from the first surface to the second surface.

18. The method as recited in claim 1, wherein the second conductive bonding pad comprises openings that include an adhesive disposed in the openings.

* * * * *